(12) United States Patent
Yi et al.

(10) Patent No.: US 10,403,355 B2
(45) Date of Patent: Sep. 3, 2019

(54) PHASE CHANGE MEMORY DEVICE CAPABLE OF DECREASING A DISTURBANCE

(71) Applicant: SK hynix Inc., Icheon-si Gyeonggi-do (KR)

(72) Inventors: Jeong Ho Yi, Seoul (KR); Jun Ho Cheon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 4 days.

(21) Appl. No.: 15/818,425

(22) Filed: Nov. 20, 2017

(65) Prior Publication Data

US 2018/0144799 A1    May 24, 2018

(30) Foreign Application Priority Data

Nov. 23, 2016    (KR) .................... 10-2016-0156698

(51) Int. Cl.
 *G11C 13/00* (2006.01)
 *G11C 8/14* (2006.01)
 *G11C 8/10* (2006.01)

(52) U.S. Cl.
CPC ...... *G11C 13/0033* (2013.01); *G11C 13/0004* (2013.01); *G11C 13/0023* (2013.01); *G11C 13/0026* (2013.01); *G11C 13/0028* (2013.01); *G11C 8/10* (2013.01); *G11C 8/14* (2013.01)

(58) Field of Classification Search
CPC ............ G11C 13/0033; G11C 13/0004; G11C 13/0023
USPC ..................... 365/163, 230.03, 148
See application file for complete search history.

(56) References Cited

U.S. PATENT DOCUMENTS

| | | | |
|---|---|---|---|
| 2011/0292749 A1* | 12/2011 | Park ................... | G11C 7/12 365/203 |
| 2012/0002476 A1 | 1/2012 | Yan et al. | |
| 2012/0033480 A1* | 2/2012 | Hosono ............. | G11C 13/0004 365/148 |
| 2013/0294136 A1 | 11/2013 | Siau et al. | |
| 2016/0196876 A1* | 7/2016 | Lee .................... | G11C 13/0026 365/63 |

* cited by examiner

*Primary Examiner* — Anthan Tran
(74) *Attorney, Agent, or Firm* — William Park & Associates Ltd.

(57) ABSTRACT

A phase change memory device may include a plurality of word lines, a plurality of bit lines, a phase change memory cell, and a discharging circuit. The word lines and the bit lines may intersect each other. The phase change memory cell may be positioned at an intersection point between the word lines and the bit lines. The discharging circuit may be configured to apply a ground voltage to a non-selected word line adjacent to a selected word line or a non-selected bit line adjacent to a selected bit line.

18 Claims, 8 Drawing Sheets

PHASE CHANGE MEMORY DEVICE CAPABLE OF DECREASING A DISTURBANCE

CROSS-REFERENCES TO RELATED APPLICATION

The present application claims priority under 35 U.S.C. § 119(a) to Korean application number 10-2016-0156698, filed on Nov. 23, 2016, in the Korean Intellectual Property Office, which is incorporated herein by reference in its entirety.

BACKGROUND

1. Technical Field

Various embodiments generally relate to a semiconductor memory device, more particularly, to a phase change memory device capable of decreasing a disturbance.

2. Related Art

A phase change memory device may use a chalcogenide material as a storage medium. The chalcogenide material in the phase change memory device may be converted into an amorphous phase and a crystalline phase by applying a current or a voltage. The amorphous phase may be a reset phase and the crystalline phase may be a set phase.

The phase change memory device may include a plurality of word lines, a plurality of bit lines intersected with the word lines and a selecting element and a storing element arranged at intersection points between the word lines and the bit lines.

As a semiconductor memory device becomes highly integrated, a gap between conductive lines may become narrower. A disturbance, which may mean that non-selected conductive lines may be affected by a voltage of a selected conductive line, may be generated. The disturbance may cause a leakage current and driving of a non-selected memory cell.

SUMMARY

According to an embodiment, there may be provided a phase change memory device. The phase change memory device may include a plurality of word lines, a plurality of bit lines, a phase change memory cell, and a discharging circuit. The word lines and the bit lines may be intersect each other. The phase change memory cell may be positioned at an intersection point between the word lines and the bit lines. The discharging circuit may be configured to apply a ground voltage to a non-selected word line adjacent to a selected word line or a non-selected bit line adjacent to a selected bit line.

According to an embodiment, there may be provided a phase change memory device. The phase change memory device may include a plurality of bit lines, a global bit line, a plurality of local bit lines, a plurality of word lines, a plurality of local switches, a global switch, and a plurality of discharging switches. The bit lines may include a plurality of even bit lines and a plurality of odd bit lines alternately arranged with each other. The local bit lines comprise even local bit lines and odd local bit lines. The even local bit lines may be arranged at one end of the even bit lines. The odd local bit lines may be arranged at the other end of the odd bit lines. The global bit line may be selectively connected with the local bit lines. The word lines may intersect with the bit lines. The local switches may be configured to selectively connect the bit lines with the local bit lines. The local switches may include a plurality of even local switches and a plurality of odd local switches. The even local switches may be configured to selectively connect the even bit lines with the even local bit lines in response to an even local selection signal. The odd local switches may be configured to selectively connect the odd bit lines with the odd local bit lines in response to an odd local selection signal. The global switch may be configured to connect the local bit lines with the global bit line in response to a global selection signal. The discharging switches may be configured to apply a ground voltage to bit lines adjacent to a selected bit line among the bit lines.

DETAILED DESCRIPTION

Figure 1:
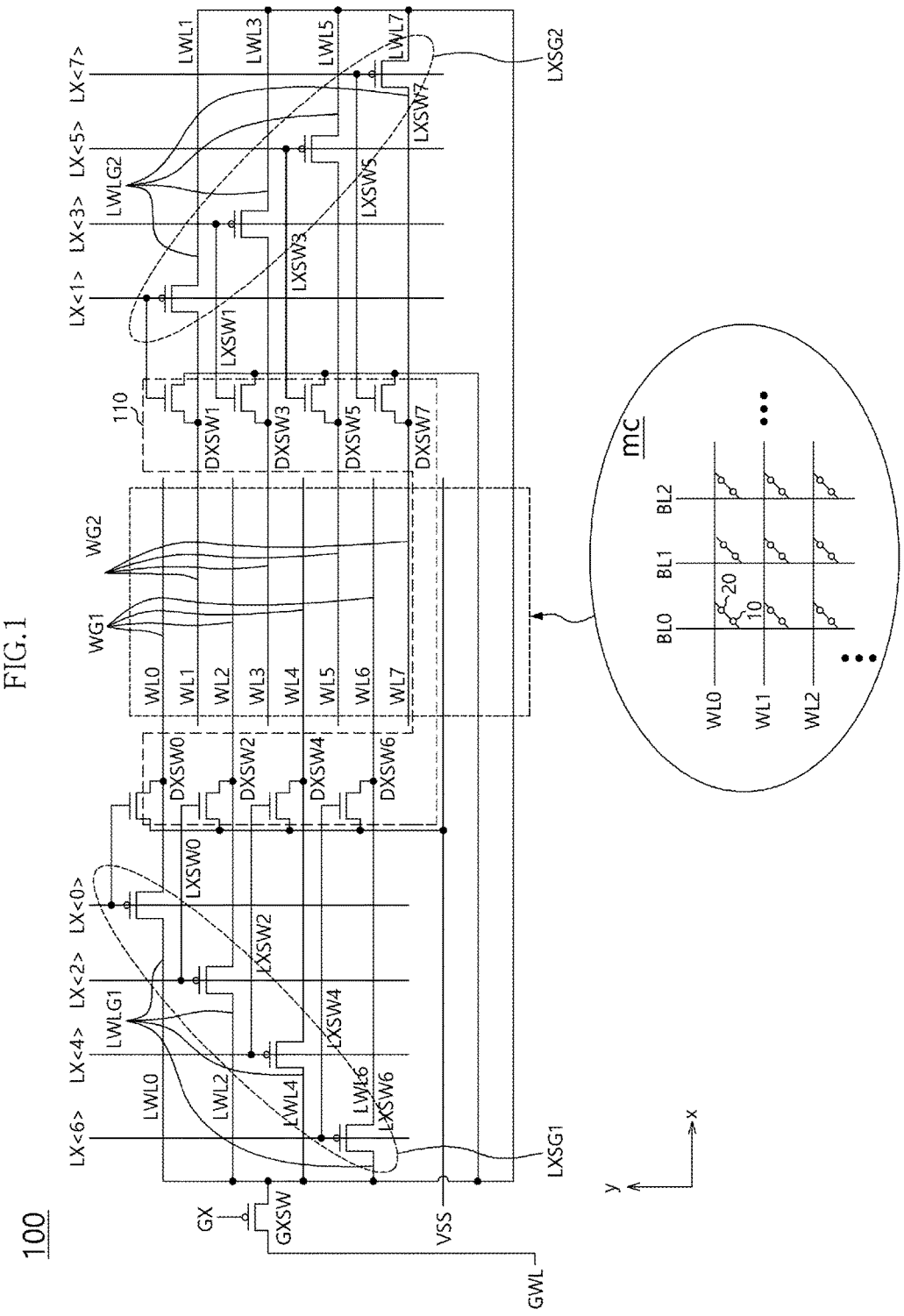
FIG. 1 is a circuit diagram illustrating a phase change memory device in accordance with example embodiments.

Various example embodiments will be described hereinafter with reference to the accompanying drawings, in which some examples of the embodiments are illustrated. The embodiments may, however, be embodied in many different forms and should not be construed as limited to the example embodiments set forth herein. Rather, these example embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a circuit diagram illustrating a phase change memory device in accordance with example embodiments.

Referring to FIG. 1, a phase change memory device 100 may include a plurality of word lines WL0-WL7, a plurality of local switches LXSW0-LXSW7, a global switch GXSW, and a plurality of discharging switches DXSW0-DXSW7.

The word lines WL0-WL7 may be extended in an x-direction in parallel. The word lines WL0-WL7 may be classified into a first word line group WG1 and a second word line group WG2. For example, the first word line group WG1 includes even word lines WL0, WL2, WL4, and WL6 and the second word line group WG2 includes odd word lines WL1, WL3, WL5, and WL7. The even word lines WL0, WL2, WL4, and WL6 of the first word line group WG1 may be alternately arranged with the odd word lines WL1, WL3, WL5, and WL7 of the second word line group WG2.

Each of the local switches LXSW0-LXSW7 may be configured to selectively connect a corresponding local word line among local word lines LWL0-LWL7 with a corresponding word line among the word lines WL0-WL7.

The local switches LXSW0-LXSW7 may be positioned at edge portions of the word lines WL0-WL7. For example, the local switches LXSW0-LXSW7 may be classified into a first local switch group LXSG1 and a second local switch group LXSG2. For example, the first local switch group LXSG1 includes even local switches LXSW0, LXSW2, LXSW4, and LXSW6 connected with the even word lines WL0, WL2, WL4, and WL6 which are arranged at first ends of the even word lines WL0, WL2, WL4, and WL6. For example, the second local switch group LXSG2 includes odd local switches LXSW1, LXSW3, LXSW5, and LXSW7 connected with the odd word lines WL1, WL3, WL5, and WL7 which are arranged at second ends of the odd word lines WL1, WL3, WL5, and WL7 opposite to the first ends. That is, the local switches LXSW0-LXSW7 may be arranged at the both sides of the word lines WL0-WL7.

Each of the local switches LXSW0-LXSW7 may be configured to transmit signals of the local word lines LWL0-LWL7 to the word lines WL0-WL7 in response to a local selection signal LX<0:7>. For example, the local switches LXSW0-LXSW7 may include a PMOS transistor driven by the local selection signal LX<0:7>. The local word lines LWL0-LWL7 may include a first local word line group LWLG1 comprised of even local word lines LWL0, LWL2, LWL4, and LWL6. The local word lines LWL0-LWL7 may also include second local word line group LWLG2 comprised of odd local word lines LWL1, LWL3, LWL5, and LWL7. The even local word lines LWL0, LWL2, LWL4, and LWL6 of the first local word line group LWLG1 may be alternately arranged with the odd local word lines LWL1, LWL3, LWL5, and LWL7 of the second local word line group LWLG2. Further, the first local switch group LXSG1 may be connected between the word lines WL0, WL2, WL4, and WL6 of first word line group WG1 and local word lines LWL0, LWL2, LWL4, and LWL6 of the first local word line group LWLG1. Still further, the second local switch group LXSG2 may be connected between the word lines WL1, WL3, WL5, and WL7 of the second word line group WG2 and local word lines LWL1, LWL3, LWL5, and LWL7 of the second word line group LWLG2.

The global switch GXSW may be connected between a global word line GWL and the local word lines LWL0-LWL7. In example embodiments, the local word lines LWL0-LWL7 corresponding to one group may be connected with the single global switch GXSW. The global switch GXSW may be configured to transmit a signal of the global word line GWL to the local word lines LWL0-LWL7 in response to a global selection signal GX. The global switch GXSW may selectively connect the local word lines LWL0-LWL7 with the global word line GWL in response to the global selection signal GX. The global switch GXSW may include a PMOS transistor.

In example embodiments, the word lines WL0-WL7 may be controlled by the single global word line GWL.

A discharging circuit 110 may include the plurality of discharging switches DXSW0-DXSW7 which may be arranged and connected between the word lines WL0-WL7 and the local switches LXSW0-LXSW7. The discharging switches DXSW0-DXSW7 may be configured to transmit a floating prevention voltage to the word lines WL0-WL7 in response to the local selection signal LX<0:7>. For example, the floating prevention voltage may be a voltage which does not change a status of a memory cell, such as a ground voltage VSS. The discharging switches DXSW0-DXSW7 may include an NMOS transistor driven by the local selection signal LX<0:7>. Thus, the same local selection signal LX<0:7> may be inputted into the local switches LXSW0-LXSW7 and the discharge switches DXSW0-DXSW7, and the local switches LXSW0-LXSW7 and the discharge switches DXSW0-DXSW7 which receive the same local selection signal LX<0:7> are driven as an inverter.

A memory cell array mc may include a plurality of bit lines BL0-BL7 and memory cells. The bit lines BL0-BL7 may intersect the word lines WL0-WL7. The memory cells may be connected to intersection points between the word lines WL0-WL7 and the bit lines BL0-BL7. Each of the memory cells may include an access element and a storing element. For example, the memory cell may be a resistive memory cell. For example, the access element includes a phase change-selecting element 10 and the storing element includes a phase change memory layer 20.

Further, the phase change-selecting element 10 and the phase change memory layer 20 may include chalcogenide. The phase change-selecting element 10 and the phase change memory layer 20 may perform switching operations and memory operations by resistance changes of the chalcogenide.

For example, when the second word line WL2 is selected, the global switch GXSW may be turned-on by applying the global selection signal GX having a low level. A voltage of the global word line GWL may be transmitted to the local word lines LWL0-LWL7.

A main word line decoder (not shown) may output a local selection signal for driving only the second local switch LXSW2. That is, the main word line decoder may output a low signal as the second local selection signal LX<2> and high signals as the rest of the local signals LX<0,1,3-7>. The main word line decoder may include a general word line decoder. Further, the first local switch group LXSG1 may be turned-on when the when a word line of the second word line group WG2 is selected by the local selection signal LX<1,3,5,7>, and the second local switch group LXSG2 may be turned-on when the word line of the first word line group WG1 is selected by the local selection signal LX<0, 2,4,6>.

When the local selection signals LX<0:7> are applied to the phase change memory device 100, the second local switch LXSW2 may be enabled. In contrast, the rest of the local switches LXSW0-1 and LXSW3-7 may be disabled. The discharging switches DXSW0-1 and DXSW3-7 connected with the disabled local switches LXSW0-1 and LXSW3-7 may be turned-on. Thus, the VSS voltage may be transmitted to the non-selected word lines WL0-1 and WL3-7.

According to example embodiments, the non-selected word lines WL0-1 and WL3-7 are not floated. The non-selected word lines WL0-1 and WL3-7 may be charged with the VSS voltage so that the non-selected word lines WL0-1 and WL3-7 are not affected by the selected word line WL2.

For example, the word lines WL0-7 may correspond to a low level conductive line, the local word lines LWL0-7 may correspond to a middle level conductive line and the global word lines may correspond to a high level conductive line.

Figure 2:
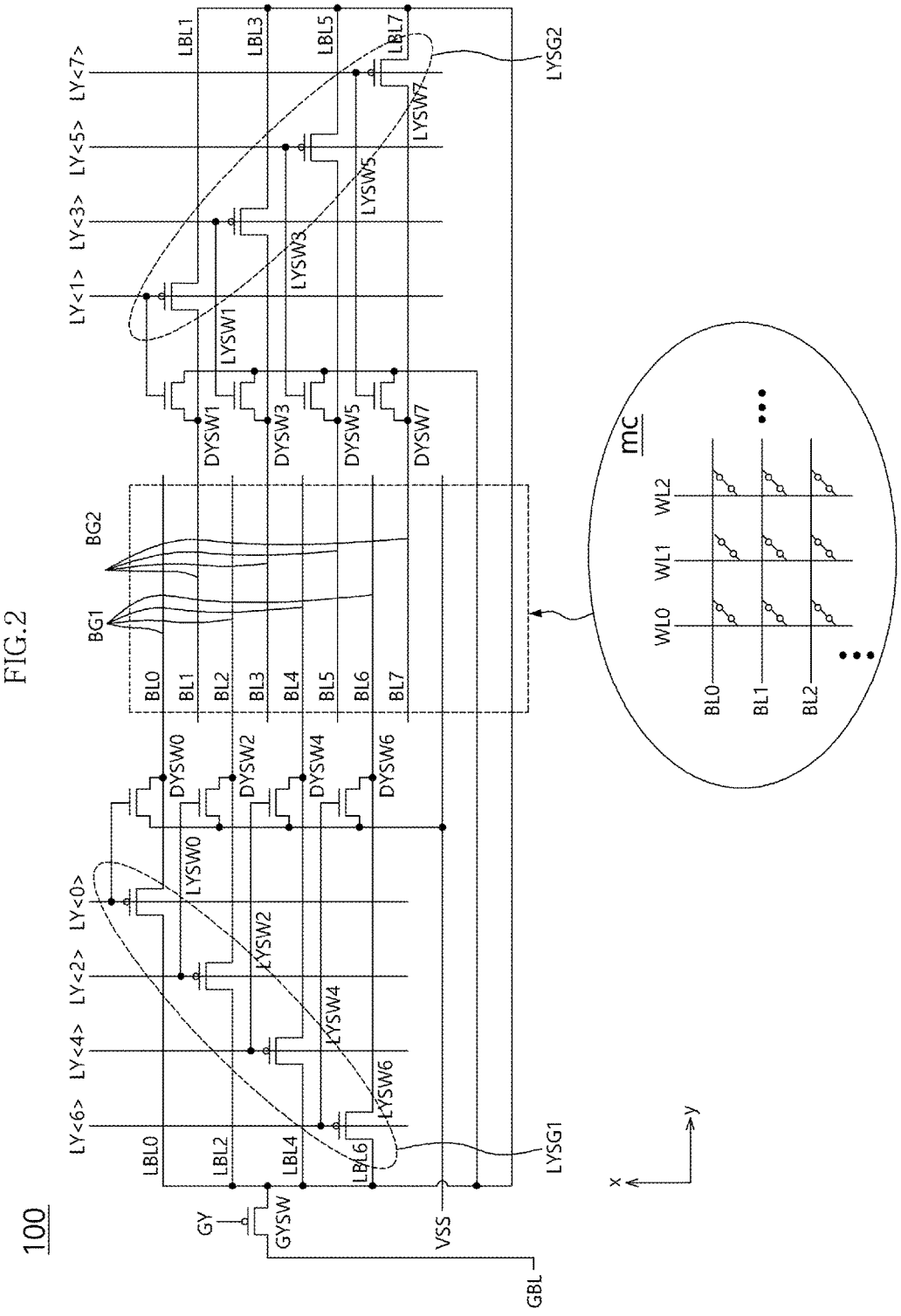
FIG. 2 is a circuit diagram illustrating a phase change memory device in accordance with example embodiments.

FIG. 2 is a circuit diagram illustrating a phase change memory device in accordance with example embodiments.

Referring to FIG. 2, the above-mentioned configurations applied to the word lines may also be applied to the bit lines BL0-BL7. A reference numeral GYSW may indicate a bit line global switch. Reference numerals LYSW0-LYSW7 may indicate local switches connected with the bit lines BL0-BL7. Reference numerals DYSW0-DYSW7 may indicate discharging switches connected with the bit lines BL0-BL7. A reference numeral BG1 may indicate a first bit line group including even bit lines BL0, BL2, BL4, and BL6 and a reference numeral BG2 may indicate a second bit line group including odd bit lines BL1, BL3, BL5, and BL7. A reference numeral LYSG1 may indicate a first local switch group including even local switches LYSW0, LYSW2, LYSW4 and LYSW6 connected with the first bit line group BG1. A reference numeral LYSG2 may indicate a second local switch group including odd local switches LYSW1, LYSW3, LYSW5, and LYSW7. The local switches LYSW0-LYSW7, including even local switches LYSW0, LYSW2, LYSW4, and LYSW6 and odd local switches LYSW1, LYSW3, LYSW5, and LYSW7 may selectively connect the bit lines BL0-BL7 with local bit lines LBL0-LBL7. Further, the plurality of local bit lines LBL0-LBL7 may include even local bit lines LBL0, LBL2, LBL4, and LBL6 and odd local bit lines LBL1, LBL3, LBL5, and LBL7. The even local bit lines LBL0, LBL2, LBL4, and LBL6 may be arranged at one end of the even bit lines BL0, BL2, BL4 and BL6, and the odd local bit lines LBL1, LBL3, LBL5, and LBL7 may be arranged at the other end of odd bit lines BL1, BL3, BL5, and BL7. A global bit line GBL may be selectively connected with the local bit lines LBL0-LBL7.

The discharging switches DYSW0-DYSW7 configured to perform an invert operation together with the local switches LYSW0-LYSW7 may be connected to the bit lines BL0-BL7 to apply the VSS voltage to a non-selected bit line. Thus, a voltage variation of the non-selected bit line may be prevented. The global switch GYSW may be configured to connect the local bit lines LBL0-LBL7 with the global bit line GBL in response to a global selection signal GY.

The word lines or the bit lines may be controlled using the single global switch GXSW or GYSW by one group. Alternatively, as shown in FIGS. 3 and 4, global switches GXSW0, GXSW1 or GYSW0, GYSW1 may be connected with the odd word lines and the even word lines or the odd bit lines and the even bit lines to control the word lines or the bit lines by even numbers and odd numbers.

Figure 3:
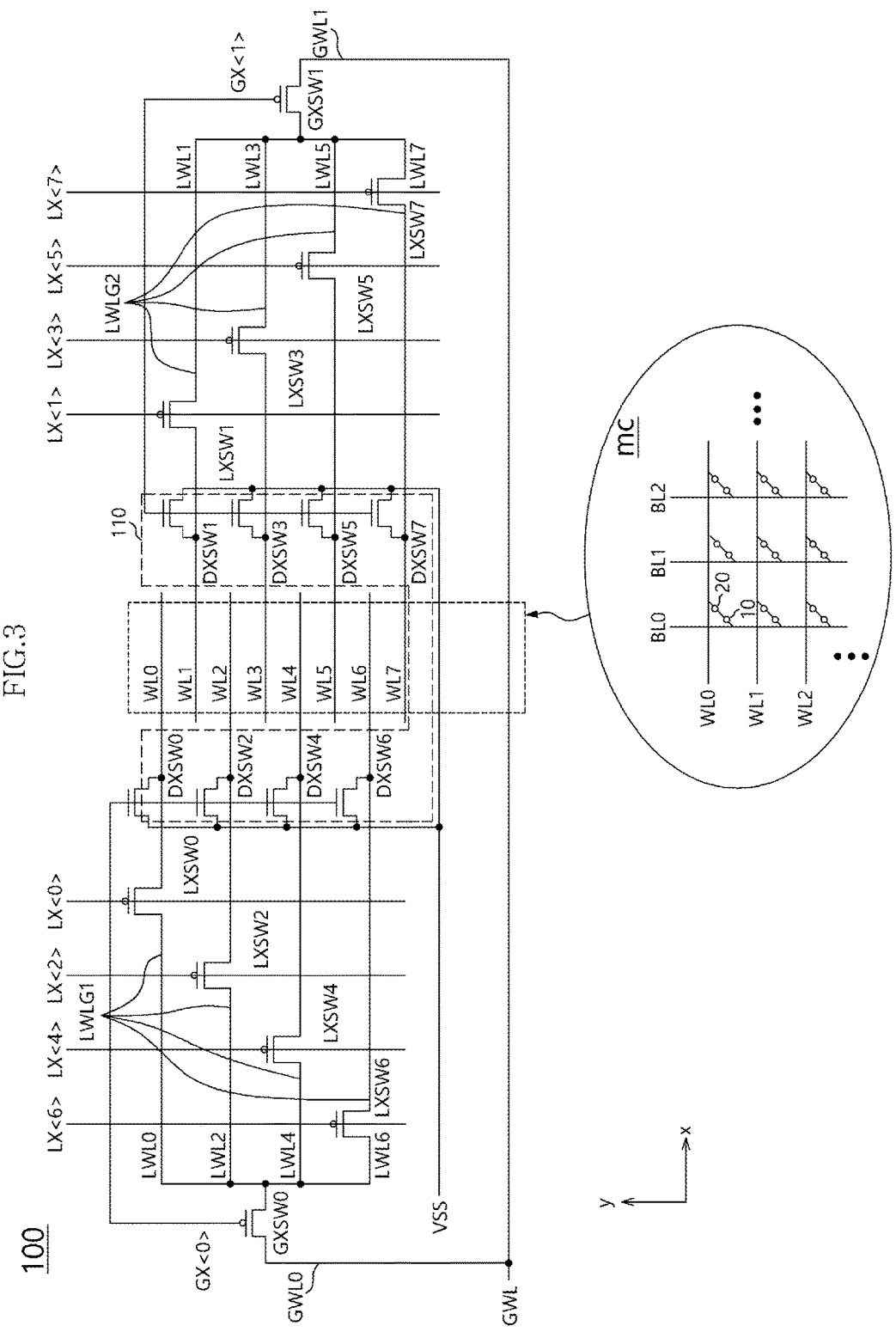
FIG. 3 is a circuit diagram illustrating a phase change memory device in accordance with example embodiments.
Figure 4:
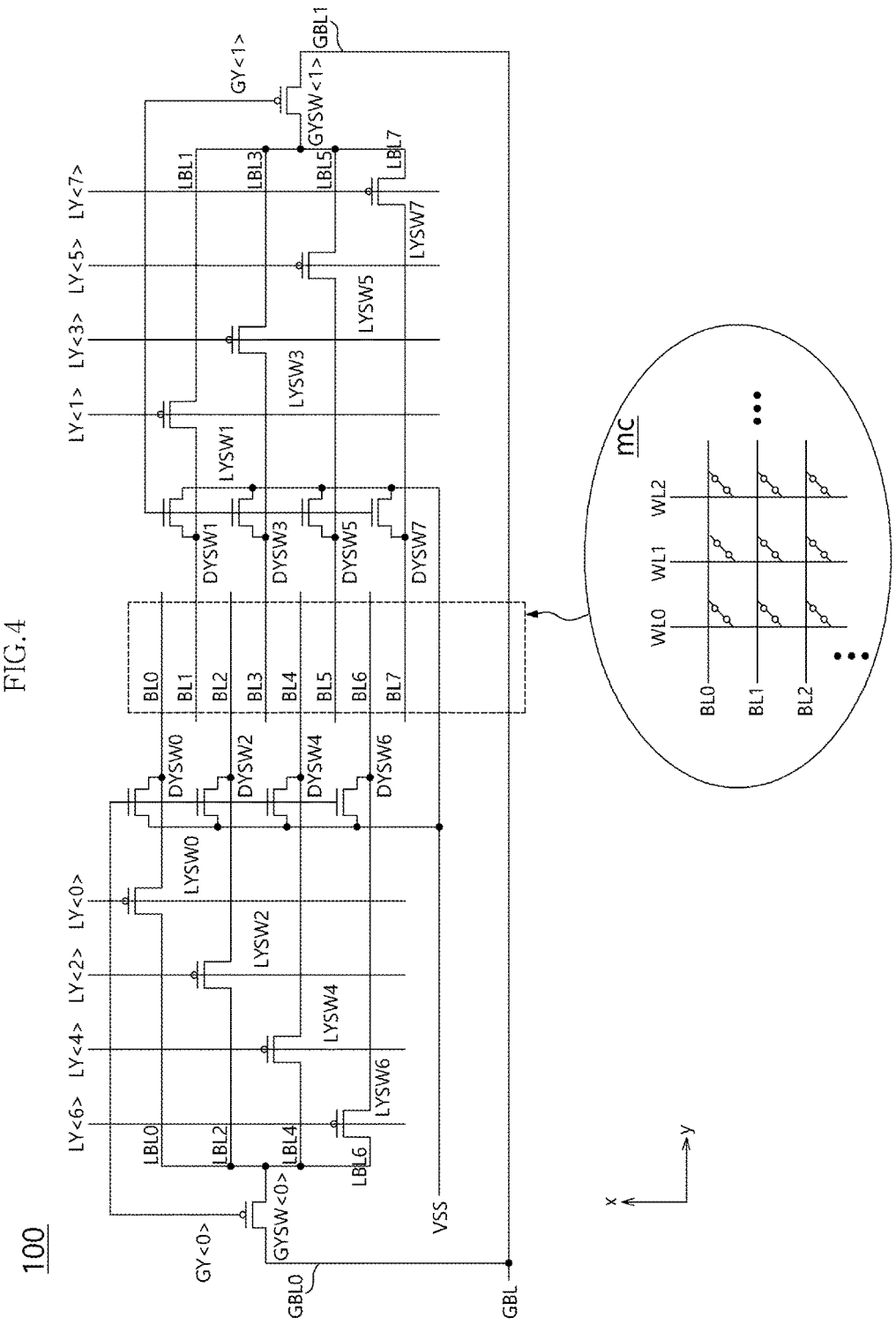
FIG. 4 is a circuit diagram illustrating a phase change memory device in accordance with example embodiments.

Referring to FIG. 3, the even local word lines LWL0, LWL2, LWL4, and LWL6 connected to the even local switches LXSW0, LXSW2, LXSW4, and LXSW6 may be electrically connected with the zeroth global switch GXSW0, hereinafter referred to an even global switch. Further, the even global switch GXSW0 may be connected between the first local word line group LWLG1 and a first global word line GWL0.

The even local switches LXSW0, LXSW2, LXSW4, and LXSW6 and the even global switch GXSW0 may include a PMOS transistor driven in response to an even global selection signal GX<0>. Even discharging switches DXSW0, DXSW2, DXSW4, and DXSW6 connected between the even word lines WL0, WL2, WL4, and WL6 and the even local switches LXSW0, LXSW2, LXSW4, and LXSW6 may include an NMOS transistor. The even discharging switches DXSW0, DXSW2, DXSW4, and DXSW6 may be driven in response to the even global selection signal GX<0> for driving the even global switch GXSW0. Thus, the even discharging switches DXSW0, DXSW2, DXSW4, and DXSW6 may perform an inverter operation together with the even global switch GXSW0.

The odd local word lines LWL1, LWL3, LWL5, and LWL7 connected to the odd local switches LXSW1, LXSW3, LXSW5, and LXSW7 may be electrically connected with the first global switch GXSW1, hereinafter referred to an odd global switch. Further, the odd global switch GXSW1 may be connected between the second local word line group LWLG2 and a second global word line GWL1.

The odd local switches LXSW1, LXSW3, LXSW5 and LXSW7 and the odd global switch GXSW1 may include a PMOS transistor driven in response to the odd global selection signal GX<1>. The odd discharging switches DXSW1, DXSW3, DXSW5 and DXSW7 may include an NMOS transistor. The odd discharging switches DXSW1, DXSW3, DXSW5, and DXSW7 and the odd global switch GXSW1 may be driven in response to the odd global selection signal GX<1>. Thus, the odd discharging switches DXSW1, DXSW3, DXSW5, and DXSW7 may perform an inverter operation together with the odd global switch GXSW1.

In order to select the second word line WL2, the even global selection signal GX<0> may be enabled to a low level. The odd global selection signal GX<1> may be disabled to a high level.

The even global switch GXSW0 may be turned-on. Signals of the global word line GWL may be transmitted to the even local word lines LWL0, LWL2, LWL4, and LWL6. In contrast, the signals of the global word line GWL are not transmitted to the odd local word lines LWL1, LWL3, LWL5 and LWL7.

A main word line decoder may output a local selection signal for driving only the second local switch LXSW2. That is, the main word line decoder may output a low signal as the second local selection signal LX<2> and high signals as the rest of the local signals LX<0,1,3-7>.

The second local switch LXSW2 may be turned-on. The odd discharging switches DXSW1, DXSW3, DXSW5, and DXSW7 may be turned-on in response to the odd global selection signal GX<1> having the high level.

The signal in the global word line GWL may be transmitted to the second word line WL2 through the second local word line. The first and third word lines WL1 and LW3 positioned at both sides of the second word line WL2 may receive the VSS voltage by driving the first and third discharging switches DXSW1 and DXSW3. Thus, the word lines WL1 and WL3 adjacent to the enabled word line WL2 may be charged with the VSS voltage so that the word lines WL1 and WL3 may not be affected by the enabled word line WL2.

Referring to FIG. 4, the above-mentioned configurations may be applied to the bit lines BL0-BL7. The even discharging switches DYSW0, DYSW2, DYSW4, and DYSW6 connected to the even bit lines may be driven in response to an even global selection signal GY<0>. Further, the even local switches LYSW0, LYSW2, LYSW4, and LWSW6 may selectively connect any one of the even bit lines BL0, BL2, BL4, and BL6 with any one of the even local bit lines LBL0, LBL2, LBL4, and LBL6 in response to an even local selection signal LY<0>, LY<2>, LY<4>, and LY<6>. Further still, the even discharging switches DYSW0, DYSW2, DYSW4, and DYSW6 may be connected between the ground voltage VSS and the even local bit lines LBL0, LBL2, LBL4, and LBL6 and may be driven inversely to the even global switch GYSW<0> in response to the even global selection signal GY<0>. The odd discharging switches DYSW1, DYSW3, DYSW5, and DYSW7 connected to the odd bit lines may be driven in response to an odd global selection signal GY<1>. Further, the odd local switches LYSW1, LYSW3, LYSW5, and LWSW7 may selectively connect any one of the odd bit lines BL1, BL3, BL5, and BL7 with any one of the odd local bit lines LBL1, LBL3, LBL5, and LBL7 in response to an odd local selection signal LY<1>, LY<3>, LY<5>, and LY<7>. Further still, the odd discharging switches DYSW1, DYSW3, DYSW5, and DYSW7 may be connected between the ground voltage VSS and the odd local bit lines LBL1, LBL3, LBL5, and LBL7 and may be driven inversely to the odd global switch GYSW<1> in response to the odd global selection signal GY<1>.

Therefore, the bit lines adjacent to the enabled bit line may be charged with the VSS voltage so that the bit lines may not be affected by the enabled bit line. The global bit line GBL may include a first global bit line corresponding to an even global bit line GBL0 and a second global bit line corresponding to an odd global bit line GBL1. The global switch may be comprised of an even global switch GYSW<0> which may be connected between the even global bit line GBL0 and the even local bit lines LBL0, LBL2, LBL4, and LBL6 where the even global switch GYSW<0> may be driven in response to the even global selection signal GY<0>. Further, the global switch may be comprised of an odd global switch GYSW<1> which may be connected between the odd global bit line GBL1 and the odd local bit lines LBL1, LBL3, LBL5, and LBL7 where the odd global switch GYSW<1> may be driven in response to the odd global selection signal GY<1>.

Figure 5:
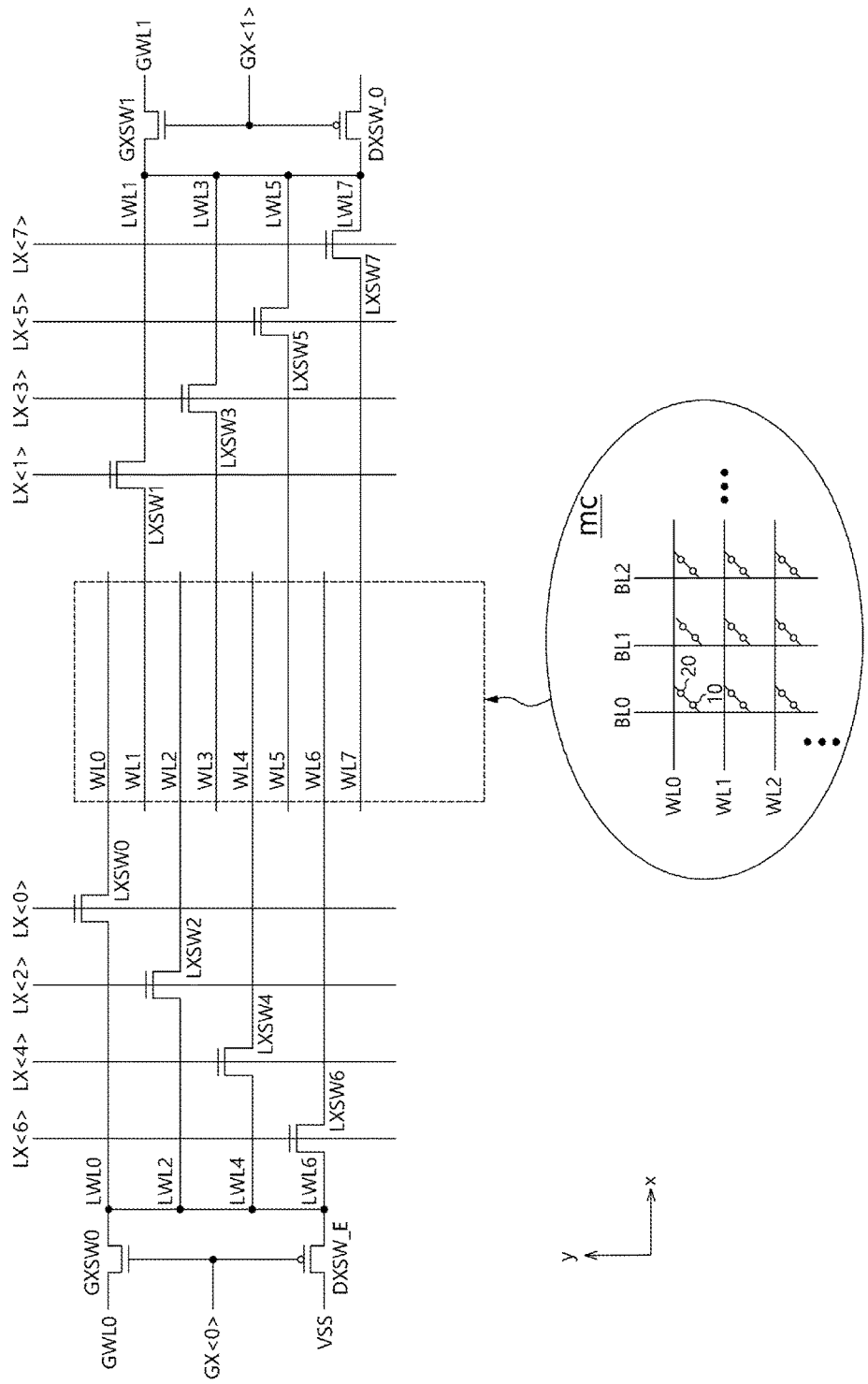
FIG. 5 is a circuit diagram illustrating a phase change memory device in accordance with example embodiments.

Referring to FIG. 5, discharging switches DXSW_E or DYSW_O may be provided to the group of the even or odd word lines WL0-WL7 to control the even or odd word lines by the group.

The first discharging switch DXSW_E may be connected with the even local switches LXSW0, LXSW2, LXSW4, and LXSW6 in common. The second discharging switch DXSW_E may transmit the VSS voltage to the even local switches LXSW0, LXSW2, LXSW4, and LXSW6 in response to the even global selection signal GX<0> for driving the even global switch GXSW0.

The second discharging switch DXSW_O may be connected with the odd local switches LXSW1, LXSW3, LXSW5 and LXSW7 in common. The second discharging switch DXSW_O may transmit the VSS voltage to the odd local switches LXSW1, LXSW3, LXSW5, and LXSW7 in response to the odd global selection signal GX<1> for driving the odd global switch GXSW1. In one example, the second discharging switch DXSW_O and the odd local switches LXSW1, LXSW3, LXSW5, and LXSW7 may be driven inversely to the first discharging switch DXSW_E and the even local switches LXSW0, LXSW2, LXSW4, and LXSW6 in response to the even global selection signal GX<0> or the odd global selection signal GX<1>.

In example embodiments, the global switches GXSW0 and GXSW1 and the local switches LXSW0-LXSW7 may include the NMOS transistor. The discharging switches DXSW_E and DXSW_O may include the PMOS transistor. Alternatively, the global switches GXSW0 and GXSW1 and the local switches LXSW0-LXSW7 may include the PMOS transistor. The discharging switches DXSW_E and DXSW_O may include the NMOS transistor.

In order to select the second word line WL3, the even global selection signal GX<0> may be disabled to a low level. The odd global selection signal GX<1> may be enabled to a high level.

When the odd global selection signal GX<1> is enabled to the high level, the odd global switch GXSW1 may be turned-on and the odd discharging switch DXSW_O may be turned-off. A signal of the odd global word line GWL1 may be transmitted to the odd local word lines LWL1, LWL3, LWL5 and LWL7.

When the even global selection signal GX<0> is disabled to the low level, the even global switch GXSW0 may be turned-off and the even discharging switch DXSW_E may be turned-on. The VSS voltage connected to the even discharging switch DXSW_E may be transmitted to the even local word lines LWL0, LWL2, LWL4, and LWL6.

The main word line decoder may output a high signal as the third local selection signal LX<3> and low signals as the rest of the local signals LX<1,5,7>. Thus, the signal of the odd global word line GWL1 may be transmitted to the third word line WL3 through the third local word line LWL3.

The main word line decoder may be configured to receive the even local selection signals LX<0,2,4,6> having a high level. Thus, the even local switches LXSW0, LXSW2, LXSW4, and LXSW6 may be turned-on so that the VSS voltage may be transmitted to the even local word lines LWL0, LWL2, LWL4, and LWL6 and the even word lines WL0, WL2, WL4, and WL6.

Figure 6:
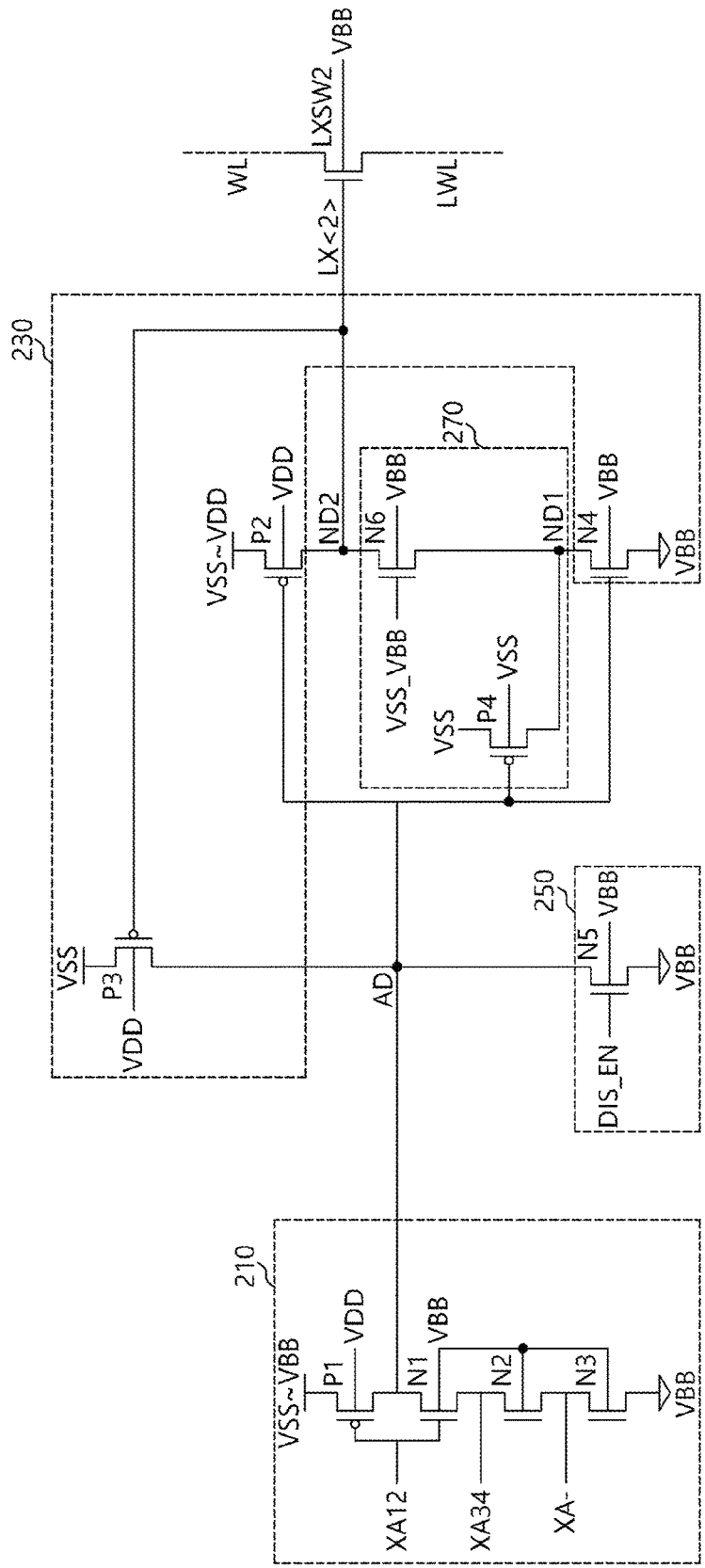
FIG. 6 is a circuit diagram illustrating a main word line decoder configured to select a local word line in FIG. 5.

FIG. 6 is a circuit diagram illustrating a main word line decoder configured to select a local word line in FIG. 5.

Referring to FIG. 6, the main word line decoder 200 may include an address-decoding unit 210, a latching unit 230, a discharge-enabling unit 250, and a stabilizing unit 270.

The address-decoding unit 210 may receive low addresses XA12, XA34, and XA. The address-decoding unit 210 may generate an address decoding signal AD for enabling a selected word line and for generating the local selection signal LX<0:7>. The address-decoding unit 210 may include a first PMOS transistor P1 and a first NMOS transistor N1 configured to receive the low address XA12 and perform an inverter operation. The address-decoding unit 210 may further include a second NMOS transistor N2 and a third NMOS transistor N3. The second NMOS transistor N2 may be connected to the first NMOS transistor N1. The second NMOS transistor N2 may be driven in response to the low address XA34. The third NMOS transistor N3 may be connected to the second NMOS transistor N2. The third NMOS transistor N3 may be driven in response to the low address XA. A driving voltage of the address-decoding unit 210, i.e., a power voltage of the first PMOS transistor P1 may correspond to a swing voltage from a VSS level to a VBB level. For example, the power voltage of the first PMOS transistor P1 may be the VSS voltage in an even mode when the even word line may be selected. In contrast, the power voltage of the first PMOS transistor P1 may be the VBB voltage in an odd mode when the odd word line may be selected.

The latching unit 230 may include an inverter and a third PMOS transistor P3. The inverter may be configured to receive the address decoding signal AD as an input signal. The third PMOS transistor P3 may be configured to receive an output signal from the inverter as an input signal. The inverter may include a second PMOS transistor P2 and a fourth NMOS transistor N4 configured to receive the address decoding signal AD. A power voltage of the second PMOS transistor P2 may be a swing voltage from a VDD level to a VSS level. For example, when the local switch, the local word line or the word line, which may be directly or indirectly connected with the second PMOS transistor P2, is not selected, the second PMOS transistor P2 may receive the VDD voltage. When the local switch, the local word line or the word line may be selected, the second PMOS transistor P2 may receive the VSS voltage.

The discharge-enabling unit 250 may include a fifth NMOS transistor N5 driven in response to a discharge-enabling signal DIS_EN. The discharge-enabling signal DIS_EN may have a level opposite to a level of a non-selected global selection signal. For example, when the odd word line is selected, the level of the discharge-enabling signal DIS_EN may be substantially the same as the level of the even global selection signal. The VBB voltage may be applied to a source and a body of the fifth NMOS transistor N5. The address decoding signal AD may be applied to a drain of the fifth NMOS transistor N5. Further, the discharge-enabling unit 250 may be connected with the address-decoding unit 210 to discharge the address decoding signal AD when the word line is not selected in response to the local selection signal LX<2>, for example.

The stabilizing unit 270 may include a sixth NMOS transistor N6 and a fourth PMOS transistor P4. The sixth NMOS transistor N6 may be connected with the third PMOS transistor P3 of the latching unit 230. The sixth NMOS transistor N6 may receive a swing voltage from the VSS level to the VBB level as a gate voltage. For example, when the local switch, the local word line or the word line, which may be directly or indirectly connected with the sixth NMOS transistor N6, is not selected, the sixth NMOS transistor N6 may receive the VBB voltage. When the local switch, the local word line or the word line is selected, the sixth NMOS transistor N62 may receive the VSS voltage. The fourth PMOS transistor P4 may be driven in response to the address decoding signal AD. The stabilizing unit 270 may be connected between the PMOS transistor P2 and the NMOS transistor N4 of the latching unit 230 to provide a connection node between the PMOS transistor P2 and the NMOS transistor N4 with a voltage having a level between a power voltage VDD of the PMOS transistor P2 and a source voltage VBB of the NMOS transistor N4.

In order to select the third word line WL3, the third local selection signal LX<3> may be enabled to a high level and the rest of the odd local selection signals LX<1,5,7> may be disabled to a low level by the main word line decoder.

Hereinafter, when any one of the odd local selection signals is selected, a process for generating even local selection signals LXSW<0,2,4,6> may be illustrated in detail. For example, the local switch LXSW in FIG. 6 may correspond to the second local switch LXSW2.

The discharging enabling signal DIS_EN of the discharge-enabling unit 250, which may be connected with the second local switch LXSW2, may have a high level opposite to the level of the even global selection signal. Thus, the discharge-enabling unit 250 may be driven so that the address decoding signal AD corresponding to the output signal of the address-decoding unit 210 may be a low level.

The low address-decoding signal AD may be inputted into the inverter. Because the word line WL2 connected to the local switch LXSW2 is not selected, the second PMOS transistor P2 in the inverter may receive the VDD voltage as the power voltage.

The inverter may output the voltage having the high level as the second local selection signal LX<2> so that the second local switch LXSW2 may be turned-on. The VSS voltage may be transmitted to the second word line WL2 through the second local word line LWL2.

The VBB voltage may be applied to the sixth NMOS transistor N6 in the stabilizing unit 270 so that the sixth NMOS transistor N6 may be turned-off. The address-decoding signal having the low level may be applied to the fourth PMOS transistor P4 so that the fourth PMOS transistor P4 may be turned-on. Thus, an output node ND1 of the stabilizing unit 270 may have the VSS level corresponding to the power voltage level of the fourth PMOS transistor P4. Because the output node ND1 of the stabilizing unit 270 may be positioned between the output node ND2 of the inverter having the VDD level and the source of the fourth NMOS transistor N4 having the VBB level, the voltage may be sequentially dropped from the VDD level to the VDD level through the VSS level so that an overload may not be applied to the phase change memory device.

Figure 7:
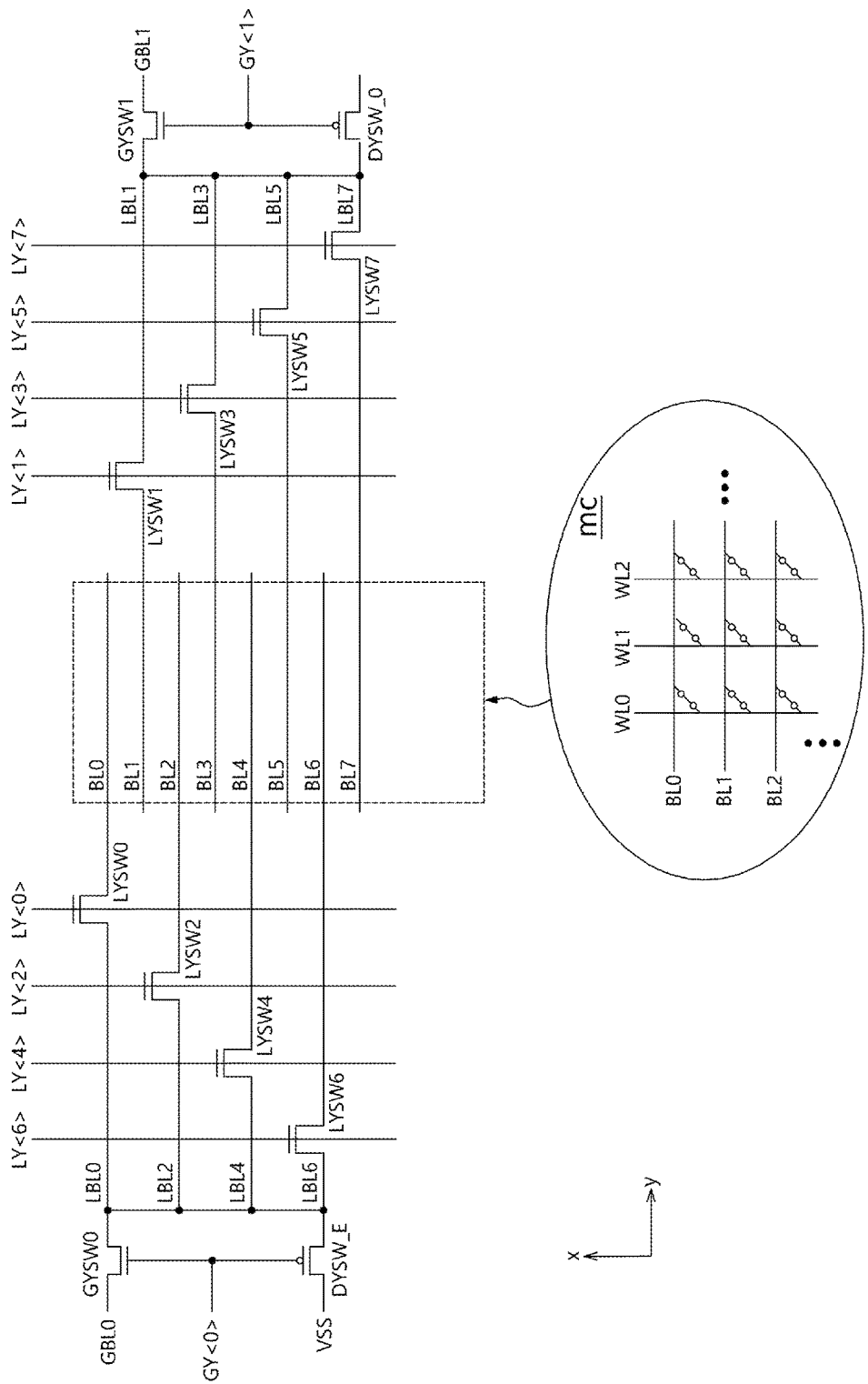
FIG. 7 is a circuit diagram illustrating a phase change memory device in accordance with example embodiments.

Referring to FIG. 7, the above-mentioned configurations applied to the word lines of FIG. 5 may also be applied to the bit lines BL0-BL7.

In example embodiments, the above-mentioned configurations may also be applied to the bit lines.

Figure 8:
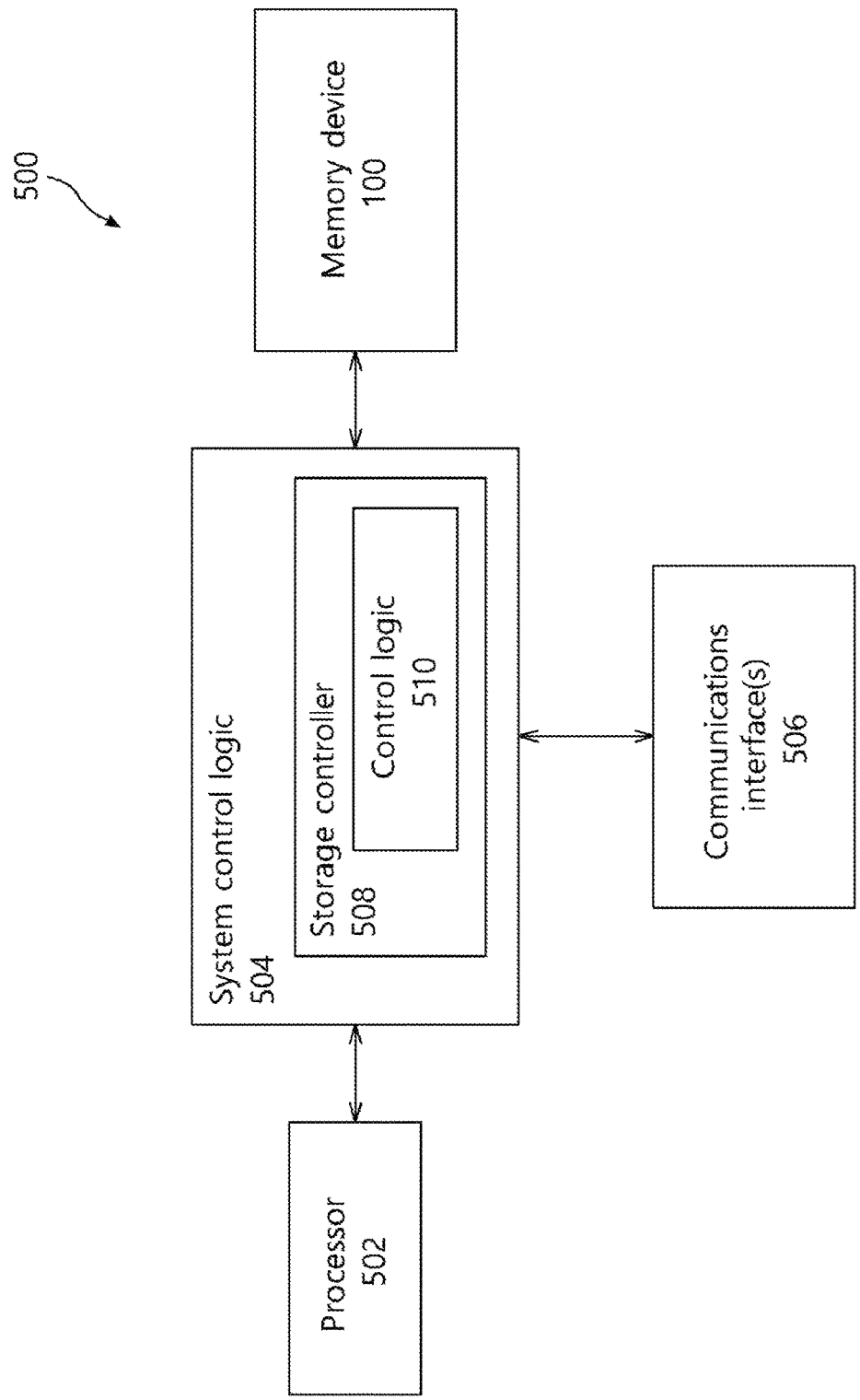
FIG. 8 is a block diagram illustrating a system in accordance with example embodiments.

FIG. 8 is a block diagram illustrating a system in accordance with example embodiments.

Referring to FIG. 8, a system 500 may include a system control logic 504, the semiconductor integrated circuit device 100 and at least one communication interface 506. The system control logic 504 may be connected with at least one of processors 502. The semiconductor integrated circuit device 100 may be connected with the system control logic 504. The communication interface 506 may be connected with the system control logic 504.

The communication interface 506 may provide an interface for the system 500 configured to be communicated with devices through at least one network. The communication interface 506 may include hardware and/or firmware. In example embodiments, the communication interface 506 may include a network adaptor, a wireless network adaptor, a telephone modem, and/or a wireless modem. The communication interface 506 may use at least one antenna for a wireless communication.

At least one of the processors 502 may be packed with control logic for at least one controller of the system control logic 504. In example embodiments, the processor 502 may be packed with the control logic for the controller of the system control logic 504 to form a system in package (SIP).

In example embodiments, at least one of the processors 502 may be arranged on a die in which the logic for the controller of the system control logic may be installed.

In example embodiments, at least one of the processors 502 may be arranged on the die in which the logic for the controller of the system control logic may be installed to form a system on chip (SOC).

In example embodiments, the system control logic 504 may include interface controllers configured to provide a device or a component communicating with at least one of the processors 502 and/or the system control logic 504 with interfaces.

In example embodiments, the system control logic 504 may include a storage controller 508 configured to provide the semiconductor integrated circuit device 100 with interfaces for controlling various access operations such as a set operation, a reset operation, a read operation, etc. The storage controller 508 may include a control logic 510 configured to control the semiconductor integrated circuit device 100. The control logic 510 may additionally generate various selection signals for controlling drivers, level shifters, global selectors, etc. When the control logic 510 is operated by at least one of the processors 502, the control logic 510 may include commands stored in a computer readable medium for performing the above-mentioned operations of the storage controller 508.

In example embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited any specific type of semiconductor device. Other additions, subtractions, or modifications are obvious in view of the present disclosure and are intended to fall within the scope of the appended claims.

What is claimed is:

1. A phase change memory device comprising:
a plurality of word lines;
a plurality of bit lines intersected with the word lines;
a plurality of resistive memory cells arranged at intersection points between the word lines and the bit lines;
a discharging circuit configured to apply a floating prevention voltage to a non-selected word line adjacent to a selected word line among the word lines or a non-selected bit line adjacent to a selected bit line among the bit lines; and
a plurality of local switches configured to connect the plurality of word lines with a plurality of local word lines, in response to a plurality of local selection signals;
wherein each of the word line discharging switches is configured to perform an inverter operation together with each of the local switches in response to a corresponding local selection signal, respectively, and
wherein the discharging circuit includes a plurality of word line discharging switches connected between the plurality of local switches and the plurality of word lines, respectively.

2. The phase change memory device of claim 1, wherein the discharging switch is turned-on to provide the word lines with the floating prevention voltage when the corresponding local switch is disabled.

3. The phase change memory device of claim 1, wherein each of the local switches comprises a PMOS transistor driven by each of the local selection signal, and each of the discharging switches comprises an NMOS transistor driven by each of the local selection signal.

4. The phase change memory device of claim 1, further comprising: at least one global switch configured to selectively connect the local word lines with a global word line.

5. The phase change memory device of claim 4, wherein the plurality of word lines comprise a first word line group and a second word line group where a selected word line of the first word line group and a selected word line of the second word line group are alternately arranged, and
wherein the plurality of local word lines comprise a first local word line group and a second local word line group, where a selected local word line of the first local word line group and a selected local word line of the second local word line group are alternately arranged,
wherein the plurality of local switches are classified into a first local switch group including local switches connected between the word lines of the first word line group and the local word lines of the first local word line group, and a second local switch group including the local switches connected between the word lines of the second word line group and the local word lines of the second local word line group, the first local switch group is arranged at one end of each of the word lines of the first word line group, the second local switch group is arranged at the other end of each of the word lines of the second word line group, and
wherein the global switch comprises a first global switch connected between the first local word line group and a first global word line, and a second global switch connected between the second local word line group and a second global word line.

6. The phase change memory device of claim 5, wherein the first global switch comprises a PMOS transistor driven in response to a first global selection signal, the second global switch comprises a PMOS transistor driven in response to a second global selection signal,
wherein the discharging switch comprises a first discharging switch connected with the word line of the first word line group and a second discharging switch connected with the word line of the second word line group; and wherein the first and second discharging switches comprise an NMOS transistor.

7. The phase change memory device of claim 1, wherein the resistive memory cell comprises an access element and a phase change memory layer, the resistive memory cell connected between the word lines and the bit lines, the access element and the phage change memory layer including a chalcogenide material.

8. The phase change memory device of claim 1, wherein the floating prevention voltage includes a ground voltage.

9. A phase change memory device comprising:
a plurality of word lines;
a plurality of bit lines intersected with the word lines;
a plurality of resistive memory cells arranged at intersection points between the word lines and the bit lines;
a discharging circuit configured to apply a floating prevention voltage to a non-selected word line adjacent to a selected word line among the word lines or a non-selected bit line adjacent to a selected bit line among the bit lines; and
a plurality of local switches configured to connect the plurality of word lines with a plurality of local word lines, in response to a plurality of local selection signals; and
a global word line; and
a global switch configured to selectively connect the local word lines with the global word line in response to a global selection signal,
wherein each of the word line discharging switches is turned on in response to the global selection signal,
wherein each of the word line discharging switches is configured to perform an inverter operation together with the global switch in response to the global selection signal, and
wherein the discharging circuit includes a plurality of word line discharging switches connected between the plurality of local switches and the plurality of word lines, respectively.

10. The phase change memory device of claim 9, wherein the global switch comprises a PMOS transistor, and the discharging switch comprises a NMOS transistor.

11. The phase change memory device of claim 9, wherein the plurality of word lines comprise a first word line group and a second word line group, the plurality of local word lines comprise a first local word lines group and a second local word line group,
the global word line comprises a first global word line and a second global word line,
wherein the plurality of local switches comprise a first local switch group including the local switches connected between the word lines of the first word line group and the local word lines of the first local word line group and a second local switch group including the local switches connected between the word lines of the second word line group and the local word lines of the second local word line group, the first local switch group is arranged at one end of the first word line group and the second local switch group is arranged at the other end of the second word line group, and
wherein the global switch comprises a first global switch connected between the first local word line group and the first global word line, and a second global switch connected between the second local word line group and the second global word line.

12. The phase change memory device of claim 11, further comprising a main word line decoder configured to generate the local selection signal,
wherein the first local switch group is turned-on when the word line of the second word line group is selected by the local selection signal, and the second local switch group is turned-on when the word line of the first word line group is selected by the local selection signal.

13. The phase change memory device of claim 12, wherein the main word line decoder comprises:
an address-decoding unit configured to receive addresses and output address decoding signals for generating the local selection signal;
a latching unit configured to receive the address decoding signals;
a stabilizing unit configured to drop an output voltage from the latching unit; and
a discharge-enabling unit connected with the address-decoding unit to discharge the address decoding signals when the word line is not selected in response to the local selection signal.

14. The phase change memory device of claim 13, wherein the latching unit comprises an inverter including a PMOS transistor and an NMOS transistor configured to receive the address decoding signals, and
wherein the stabilizing unit is connected between the PMOS transistor and the NMOS transistor in the latching unit to provide a connection node between the PMOS transistor and the NMOS transistor with a voltage having a level between a power voltage of the PMOS transistor and a source voltage of the NMOS transistor.

15. A phase change memory device comprising:
a plurality of bit lines including even bit lines and odd bit lines alternately arranged, each of the even bit lines including one end and an other end, and each of the odd bit lines including one end and an other end;
a plurality of local bit lines including even local bit lines and odd local bit lines, the even local bit lines arranged at the one ends of the even bit lines, and the odd local bit lines arranged at the other ends of the odd bit lines;
a global bit line selectively connected with the local bit lines;
a plurality of word lines intersected with the bit lines;
a plurality of local switches configured to selectively connect the bit lines with the local bit lines, the local switches including even local switches and odd local switches, the even local switches configured to selectively connect any one of the even bit lines with any one of the even local bit lines in response to an even local selection signal, and the odd local switches configured to selectively connect any one of the odd bit lines with any one of the odd local bit lines in response to an odd local selection signal;
a global switch configured to connect the local bit lines with the global bit line in response to a global selection signal; and
a plurality of discharging switches configured to apply a ground voltage to bit lines adjacent to a selected bit line among the bit lines,
wherein each of the discharging switches is configured to perform an inverter operation together with each of the local switches, in response to a corresponding local selection signal.

16. The phase change memory device of claim 15, wherein the global bit line comprises an even global bit line and an odd global bit line, wherein the global switch comprises an even global switch connected between the even global bit line and the even local bit line driven in response to an even global selection signal, and an odd global switch connected between the odd global bit line and an odd local bit line driven in response to an odd global selection signal, and wherein the discharging switches comprise an even discharging switch connected between the even bit line and the even local bit line to be driven inversely to the even global switch in response to the even global selection signal, and an odd discharging switch connected between the odd bit line and the odd local bit line to be driven inversely to the odd global switch in response to the odd global selection signal.

17. The phase change memory device of claim 15, wherein the global bit line comprises an even global bit line and an odd global bit line, wherein the global switch comprises an even global switch connected between the even global bit line and the even local bit line in response to an even global selection signal, and an odd global switch connected between the odd global bit line and an odd local bit line in response to an odd global selection signal, and wherein the discharging switches comprise an even discharging switch connected between a ground voltage and the even local bit line to be driven inversely to the even global switch in response to the even global selection signal, and an odd discharging switch connected between the ground voltage and the odd local bit line to be driven inversely to the odd global switch in response to the odd global selection signal.

18. A phase change memory device comprising:

a plurality of bit lines including even bit lines and odd bit lines alternately arranged, each of the even bit lines including one end and an other end, and each of the odd bit lines including one end and an other end;

a plurality of local bit lines including even local bit lines and odd local bit lines, the even local bit lines arranged at the one ends of the even bit lines, and the odd local bit lines arranged at the other ends of the odd bit lines;

a global bit line selectively connected with the local bit lines;

a plurality of word lines intersected with the bit lines;

a plurality of local switches configured to selectively connect the bit lines with the local bit lines, the local switches including even local switches and odd local switches, the even local switches configured to selectively connect any one of the even bit lines with any one of the even local bit lines in response to an even local selection signal, and the odd local switches configured to selectively connect any one of the odd bit lines with any one of the odd local bit lines in response to an odd local selection signal;

a global switch configured to connect the local bit lines with the global bit line in response to a global selection signal; and a plurality of discharging switches configured to apply a ground voltage to bit lines adjacent to a selected bit line among the bit lines, wherein each of the discharging switches is configured to perform an inverter operation together with the global switch, in response to the global selection signal.

* * * * *